United States Patent [19]

Chappell et al.

[11] 4,351,706
[45] Sep. 28, 1982

[54] ELECTROCHEMICALLY ERODING SEMICONDUCTOR DEVICE

[75] Inventors: Terry I. Chappell, Amawalk; Geroge D. Pettit, Mahopac; Jerry M. Woodall, Bedford Hills, all of N.Y.

[73] Assignee: International Business Machines Corporation, Armonk, N.Y.

[21] Appl. No.: 134,723

[22] Filed: Mar. 27, 1980

[51] Int. Cl.$^3$ .......................... C25F 3/12; C23F 1/02; H01L 21/42
[52] U.S. Cl. .............................. 204/129.3; 204/129.4; 204/129.65; 204/129.75; 156/643; 156/655
[58] Field of Search ........... 204/129.3, 129.65, 224 R, 204/224 M, 129.75, 129.4; 156/643, 655

[56] References Cited

U.S. PATENT DOCUMENTS

| 3,265,599 | 8/1966 | Soonpaa ........................... 204/129.3 |
| 3,706,645 | 12/1972 | Lasser ............................... 204/129.3 |
| 3,890,215 | 6/1975 | DiLorenzo et al. .......... 204/129.3 X |
| 4,007,104 | 2/1977 | Summers et al. ............. 204/129.3 X |
| 4,028,207 | 6/1977 | Faktor et al. ................. 204/129.3 X |
| 4,069,121 | 1/1978 | Baud et al. ................... 204/224 R X |
| 4,142,953 | 3/1979 | Lovelace .......................... 204/129.3 |

FOREIGN PATENT DOCUMENTS

847927 9/1960 United Kingdom ............. 204/129.3

OTHER PUBLICATIONS

Gärtner, W. W., "Depletion-Layer Photoeffects in Semiconductors", Phys. Review, vol. 116, #1, Oct. 1, 1959, pp. 84–87.
Logan, R. A. et al., "The Anodic Oxidation of GaAs in Aqueous $H_2O_2$ Solution", J. Electrochem. Soc., Sol.-State Sci. & Tech., Oct. 1973, pp. 1385–1390.
Müller, H. et al., "Anodic Oxidation of GaAs as a Technique to Evaluate Electrical Carrier Concentration Profiles", J. Elec. Soc., May 1975, pp. 651–655.
Rode, D. L. et al., "Electrolytic Etching and Electron Mobility of GaAs for FET's", Sol. State Elec. 1974, vol. 17, pp. 1119–1123.
Doerbeck, F. H., "Materials Technology for X-Band Power GaAs FETs with Uniform Current Characteristics", Inst. Phys. Conf. Ser. No. 45, Chap. 4.
Shimano, A. et al., "Light-Controlled Anodic Oxidation of n-GaAs and its Application to Preparation of Specified Active Layers for MESFET's", IEEE Trans. on Electron Devices, vol. ED-26, #11, Nov. 1979.
Hasegawa et al., "Anodic Oxidation of GaAs in Mixed Solutions of Glycol and Water", Journal Elec. Soc., vol. 123, No. 5, 1976, pp. 715–723.
Hasegawa et al., "On the Behaviors of the Cell Voltage during Anodic Oxidation of GaAs under Dark and Illuminated Conditions", Jap. J. Apply. Phys., vol. 15, (1976), #12.

*Primary Examiner*—Donald R. Valentine
*Attorney, Agent, or Firm*—Alvin J. Riddles

[57] ABSTRACT

Semiconductor devices are fabricated that have precise uniform thickness regions formed by a self-limiting process in which light generated hole-electron pairs are used as a source of current in electrochemical erosion. A self-aligned MESFET semiconductor structure is provided with the gate positioned in an etched undercut of the source and drain region and enhancement and depletion mode FET devices may be made on the same substrate.

9 Claims, 6 Drawing Figures

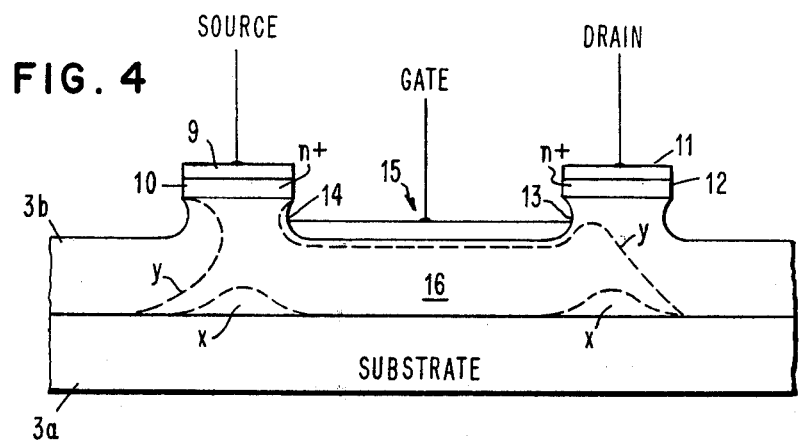
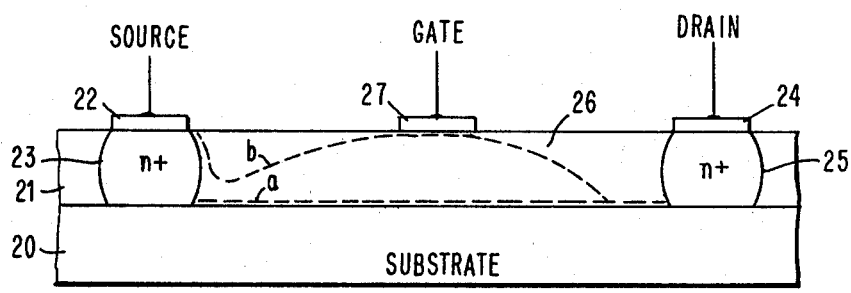
FIG. 6

ELECTROCHEMICALLY ERODING SEMICONDUCTOR DEVICE

TECHNICAL FIELD

The technical field of the invention is that of semiconductor device fabrication. In this field it is frequently desirable to provide an array of interconnected devices having identical performance. In such a situation each of the many devices are formed in a region of a semiconductor wafer of material that is maintained to very precise specifications. Further, in order to get a high density of devices and high performance from each of those devices on a semiconductor chip or wafer, each device must be made in the absolute minimum of semiconductor material yet the dimensions of each device and the spacing between the devices may not vary from one to another.

BACKGROUND ART

As the technology of arrays of devices have developed, the metal-semiconductor of MESFET type of device has been found to be advantageous because of its packing density and simplicity of manufacture. The MESFET device employs a charge provided through a gate electrode to modulate current flow in a portion of the device called a channel between two electrodes known as source and drain electrodes. There are two types of such devices. An enhancement mode type of device wherein the charge on the gate electrode enhances the presence of carriers in the current conducting channel and the depletion mode type of device wherein the charge on the gate operates to deplete the current conducting channel of carriers. The enhancement mode device has essentially no current flow in the "off" condition whereas the depletion mode device has current flow in the "off" condition. In order to make arrays of such devices all devices are each made in an identical semiconductor region of the order of a thousand angstroms in thickness, with very precise electrode spacing. Such criteria have been difficult to achieve.

BRIEF DESCRIPTION OF THE DRAWINGS

FIG. 4 is an illustration of a MESFET device of the invention.

FIG. 5 is an illustration of a prior art MESFET device.

FIG. 6 is an illustration of both enhancement and depletion mode devices on the same substrate.

DISCLOSURE OF INVENTION

The invention involves the fabrication of semiconductor devices wherein the device has a current conducting region fabricated by a light-controlled self-limiting etching or erosion process. In the process, light is applied to semiconductor material while immersed in an etchant solution and hole-electron pairs are produced, providing a light induced minority carrier current which passes into the etchant producing electrochemical erosion. The etching diminishes to zero when the material becomes thin enough (a) to reduce hole-electron pair generation in the current conducting region, (b) to permit a portion of the light induced minority carriers to be swept into an underlying inactive region and, (c) to impede majority carrier current conduction out of the electrochemically eroding region. This occurs as a precise value of the mathematical product of thickness and the square root of the dopant concentration is reached. Since the self-limiting dimension is governed by the ability to generate and transport hole-electron pairs in the device, the etching proceeds for each device until the mathematical product of the thickness and the square root of the dopant concentration is the same at each device over the entire surface of the semiconductor material. The end point thickness dimension is governed by the properties of the material being etched, the wavelength of the light being employed, the pH of the etchant solution and any electrical stress or bias applied across the device. The fabrication technique, when employed in connection with masking provides a self-aligned MESFET structure with an advantageous conductive region. In the MESFET structure the conditions of the self-limiting etching operation operates to facilitate an undercut of the source and drain contact region yielding a self-alignment capability for the gate.

BEST MODE FOR CARRYING OUT THE INVENTION

Figure 1:
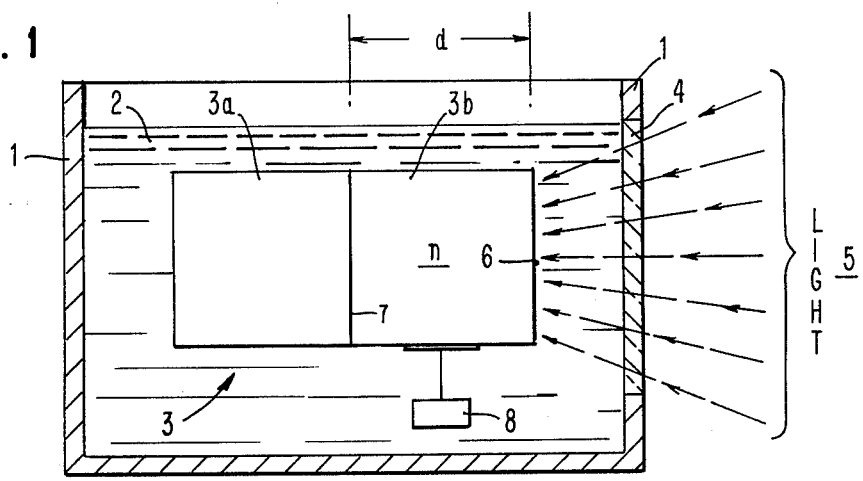
FIG. 1 illustrates the electrochemical erosion operation.

Referring to FIG. 1, a schematic view is provided of a container 1 containing an electrochemical etching solution 2, having a characteristic such that the decomposition products of a semiconductor member 3 will dissolve into the solution 2 during the etching of the semiconductor 3. This characteristic is provided by control of the pH of the solution 2.

The semiconductor 3 has a first substrate region 3a and a second region 3b which is to be etched to the precise thickness value desired. The thickness value is shown as dimension d. The substrate 3a is usually of higher resistivity or semi-insulating material that is epitaxially joined at a line of demarcation 7 which may be a p-n junction. The conductivity type of the region 3b has been selected for illustration purposes as n and under this illustration the minority carriers are holes. The container 1 has a translucent section 4 which permits light 5 to enter and impinge on the surface 6 that is exposed to the region 3b.

A majority or electron carrier transport electrode 8 is schematically shown electrically connected to the region 3b. The electrode 8 may be used to facilitate the transport of majority carriers away from the electrochemical erosion interface 6.

Figure 2:
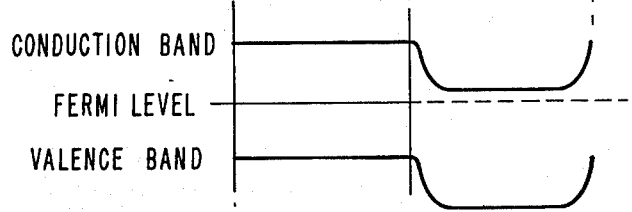
FIG. 2 is an energy band diagram of the material at the beginning of the erosion operation dimensionally correlated with FIG. 1.

The energy band diagram of semiconductor 3 that is dimensionally correlated with semiconductor 3 in FIG. 1 is provided in FIG. 2.

The fabrication technique of the invention operates because hole-electron pairs are produced in the region 3b by the light 5 falling on the electrochemical erosion surface 6. The resulting current produced by the minority or hole carriers provides a current into the etchant solution 2 which electrochemically erodes the surface 6. The light induced electrochemical etching continues in the presence of light to a dimension which is thin enough to (a) reduce hole-electron pair generation in the current conducting region adjacent the surface 6, (b) to permit a portion of the light induced minority carriers to be swept into the underlying inactive region 3a and, (c) to impede majority carrier current conduction out of the electrochemically eroding region. A reduction of hole-electron pair generation occurs when the dimension d approaches the light absorption depth of the material 2b. Light absorption depth is a well-defined technical term in light applications in the art and is labelled $1/\alpha$. The dimension $1/\alpha$ is the portion of the material 3b from surface 6 in which most of the hole-electron pairs are generated under the starting conditions.

The hole-electron pairs when formed by the light 5 to depth $1/\alpha$, provide minority carrier flow into the etchant solution 2. The majority carriers are transported away from the surface 6 either to remote portions of the semiconductor 3b or by being conducted away through an electrode such as 8 into the solution 2. The etchant solution 2 is maintained under pH conditions so that the reaction products are swept away providing thereby continuous erosion. This may be contrasted with electrochemical anodization wherein the reaction products, usually in the form of an oxide layer, remain.

Figure 3:
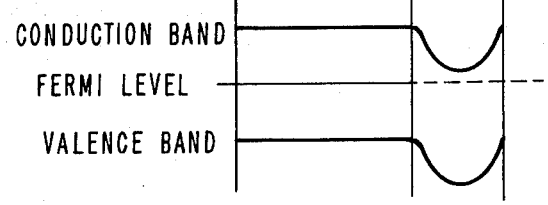
FIG. 3 is an energy band diagram at the completion of the erosion operation dimensionally correlated with FIGS. 1 and 2.

Referring next to FIG. 3 which shows the energy band diagram when the surface 6 has been eroded away until the dimension $1/\alpha$ represents the distance from the surface 6 to the demarcation 7 with the substrate. In FIG. 3 the energy band diagram is again dimensionally correlated with the semiconductor 3 in FIG. 1. At the point where the remaining dimension d of 3b is $1/\alpha$, as may be seen by FIG. 3, the minority carrier-hole current becomes limited by a number of factors that in combination operate to effectively terminate the electrochemical erosion. The factors are a reduction in hole-electron pair generation as the material 3b becomes thinner, the minority carriers are now sufficiently proximate to the underlying substrate that they can flow in that direction, and majority carrier transport out of the erosion region becomes difficult as the thickness is reduced.

It will be apparent to one skilled in the art that one of the major advantages of the technique set forth is that thickness variations across the surface of the illustrative semiconductor member 3, which may be a wafer and in which a plurality of devices are to be fabricated in the region 3b between the interface 7 with the substrate 3a and the surface 6, do not affect the etching progress because the etching will continue until the end point dimension is reached for each and every point over the surface 6. Since the etching process is self-limiting, all devices would have a region that was etched at the original rate right until the thickness dimension approaches $1/\alpha$ and then the etching slows and then stops while it continues on others until the dimension $1/\alpha$ is approached for all. It should be noted that the final self-limiting dimension is determined by the three previously mentioned factors that in combination operate to effectively terminate the electro-chemical erosion. Also, it should be noted that while the fabrication process has been illustrated in the absence of bias, one skilled in the art in the light of the principles set forth may readily make the transition to a condition involving bias across the interface between regions 3a and 3b by appropriate electrical connections to the semiconductor 3 and the solution 2. The presence of bias will operate to change the manner in which the three factors act in combination to terminate the electro-chemical erosion thereby providing flexibility in selecting the ultimate thickness dimension d. A similar transition may be made for the size and positioning of the electrode 8 to facilitate the majority carrier transport mechanism.

It is advantageous that the substrate 3a contribute minimal hole current to support the etching process. This condition may be accomplished in a number of ways. The following are some examples. The lifetime in the substrate 3a may be made to be very low so as to keep excess carrier concentration in the substrate small. An electric field may be arranged under reverse bias at the interface 7 between the regions 3a and 3b so as to sweep holes formed in the substrate away from the interface 7 and to confine them there until they recombine. The recombination rate in a depletion region that will be associated with the interface 7, may be designed to be high for non-radiative carrier recombination by providing defect or impurity type recombination centers in the region which also will contribute to lowering the excess hole concentration and hence the hole current from the substrate 3a.

Since $1/\alpha$ depends on the wavelength of the light 5, the fabrication technique of the invention permits selection of the dimension d by adjusting the wavelength of the light 5.

One variation in the light controlled etching process would be to employ a short circuit mode whereby region 3b is connected to electrode 8 to enhance minority carrier flow into the etchant solution and majority carrier flow into electrode 8 thereby increasing the etching. On the other hand, operation in the open circuit mode whereby region 3b is not connected to electrode 8 will tend to slow down the etching.

In order to enable one skilled in the art to have a starting place in which to practice the invention a set of specifications for a particular material is provided, it being apparent to one skilled in the art that, in the light of the principles set forth, many specific applications may be arranged. The semiconductor material in region 3b is n-conductivity type GaAs doped to $10^{17}$, epitaxially joined to semi-insulating GaAs in region 3a doped with Cr. The etchant solution 2 is 10% HCl, the light 5 is a 1 milliwatt He-Ne laser having a light wavelength at 6328 Å.

Under these conditions the surface 6 is electrochemically eroded away in a 10 minute period to a depth of 80 micrometers.

The fabrication technique of the invention also provides an undercut structure particularly useful to provide self-alignment of electrodes in the field effect transistor or FET device. In devices of this type it is advantageous to be able to precisely position a gate electrode with respect to the source and drain electrodes. The fabrication technique of the invention when the etching takes place through a mask, exhibits a uniform lateral etch effect that produces a useful undercut structure.

The structure is illustrated with a form of FET device known as a metal semiconductor transistor (MESFET) although it will be apparent to one skilled in the art that the undercut structure will have applications in a wide variety of aligned electrode devices.

Referring next to FIG. 4, a self-aligned enhancement mode MESFET of the invention is illustrated. The device is made on a semiconductor 3 as processed in connection with FIGS. 1, 2 and 3 consisting of a substrate 3a and the active region 3b. The device has a source region metal contact 9 having associated thereunder a high conductivity region 10 and a drain region metal contact 11 having associated thereunder a high conductivity region 12.

The region 3b is undercut under the high conductivity regions 10 and 12 at points 13 and 14, respectively, a uniform distance which may be relied upon for electrode-alignment purposes. A metal Schottky gate type electrode 15 is self-aligned in the regions between the source 9, 10 and drain 11, 12.

The structure of FIG. 4 is fabricated along the lines of the technique described in connection with FIGS. 1, 2 and 3 using a mask over implanted regions. The semiconductor 3 may be fabricated by providing a layer of low resistivity n-type semiconductor material for example, GaAs doped to $10^{17}$ cm$^{-3}$ on a low lifetime semi-insulating substrate, for example, Cr doped GaAs. A photolithographically defined shallow n+ region is implanted to define the source and drain regions 10 and 12, respectively, such as by ion implantation through a non-etching metal as Au-Ge-Ni which is then used to form the contacts 9 and 11. The photoetching process described in connection with FIGS. 1, 2 and 3 then is employed with the metal contacts 9 and 11 preventing etching of the n+ regions 10 and 12.

Since during the electrochemical erosion the region 3b is fully depleted of carriers and has a long lifetime as compared with the implanted high conductivity regions 10 and 12, lateral etching is enhanced and precise and uniform undercuts under masked regions such as points 13 and 14 are provided. The undercut condition then facilitates the self-alignment of the gate 15 over the channel 16 in the material 3b between the source 9, 10 and drain 11, 12.

Fabrication of the enhancement mode type MESFET device of FIG. 4 by the present invention has several advantages over thinning techniques such as aqueous anodization. First, under anodization conditions the metallization 9 would either dissolve or act as a low resistance current path which prevents the establishment of the required anodization potential across interface 6 of FIG. 1, to form the oxide.

Secondly, applied anodization potentials preclude thinning of region 16 of FIG. 4, to the thickness required for enhancement mode MESFET devices.

The MESFET structure of FIG. 4 has certain advantages in performance in the mode of operation known as the enhancement mode wherein the gate signal enhances conductivity in a channel that is depleted of carriers. These advantages can best be appreciated by comparison with a typical prior art enhancement mode structure such as is shown in FIG. 5.

Referring to FIG. 5 a substrate 20 is provided with an epitaxial device region 21. A metal source electrode contact 22 with an associated n+ region 23 extending to the substrate 20 is provided. A metal drain contact 24 having an associated n+ region 25 extending to the substrate 20 is also provided. The n+ regions 23 and 25 penetrate significantly into the region 21 and define the ends of the channel 26. The gate 27 is positioned over the channel 26 midway between the source electrode 22, 23 and the drain electrode 24, 25.

In the prior art device of FIG. 5 when no voltage is applied to the gate 27, the channel 26 is depleted of carriers down to the dotted line "a" which is very close to the interface with the substrate 20 and the current flow between source and drain is confined to the very small portion of the channel between the dotted line "a" and the substrate 20. When a positive voltage is applied to the gate 27, the conductive region is changed to that below the dotted line "b" wherein the conductive region exhibits some skew due to the potential drop from source to drain.

In contrast, referring again to FIG. 4 in the structure of the invention, the n+ regions 10 and 12 do not penetrate into the channel 16. This, along with the lower gate 15, operates in the "no signal" condition to confine the conductive region wherein the carriers are not depleted to the regions under the dotted lines "x" and the substrate 3a. When a signal is applied to the gate 15, the conductive region follows the dotted line "y" again skewed due to the potential difference between source and drain but now it encompasses much more of the channel 16.

The device of the invention when compared to the device of FIG. 5 will have a lower source-to-drain series resistance due to the reduced depletion region within channel 16 and in turn will have a higher transconductance and higher performance both in terms of speed and noise margin.

Referring next to FIG. 6 an illustration is provided of both enhancement and depletion mode devices on the same substrate 3a. In the structure of FIG. 6 the region 3b is implanted and etched through a mask such that both the structure of FIG. 4 is produced and at the same time the source and drain electrodes of a depletion mode device are produced with a separation between them. This may be seen in FIG. 6 wherein the active device region 3b on the substrate 3a is etched in two places under different conditions to provide the precise enhancement mode device thickness labelled $T_e$ for the channel 16 and a depletion mode device precise thickness $T_d$ for the channel 26. The undercuts 13, 14 provide alignment and separations. In the depletion mode device the corresponding elements are labelled with the suffix "a" and the gate 15a is found at higher thickness dimension $T_d$ over the depletion mode channel 26.

What has been described is a technique of fabrication of semiconductor devices by electrochemical erosion using as a current photogenerated carriers.

The structural etching properties of the technique are employed in a unique undercut MESFET device and in the fabrication of both enhancement and depletion mode devices on the same substrate.

Having described the invention, what is claimed as new and what is desired to secure by Letters Patent is:

1. A process of electrochemically eroding a semiconductor member to a specific dimension comprising in combination the steps of:

immersing at least the region to be eroded of a semiconductor body in a fluid, said region being unbiased with respect to said fluid and said fluid having the property that erosion of said semiconductor by said fluid occurs only in the presence of electric current flowing from said semiconductor into said fluid, and illuminating said semiconductor with light having a frequency capable of penetrating into said semiconductor in the vicinity of said specific dimension.

2. The process of claim 1 wherein the semiconductor is GaAs.

3. In a process of uniformly electrochemically eroding simultaneously, each to a precise dimension, each device in an array of semiconductor devices in a layer epitaxial with a supporting substrate layer together comprising a semiconductor wafer, the improvement comprising:

immersing at least the layer of said wafer containing said devices in a fluid, said layer being unbiased with respect to said fluid and said fluid having the property of being able to erode said immersed layer only in the presence of an electric current flowing from said layer into said fluid, and illuminating said layer with light having a frequency capable of penetrating into said layer in the vicinity of said precise dimension.

4. The process of claim 3 wherein said layer is GaAs.

5. The process of claim 4 wherein said substrate layer is semi-insulating GaAs doped with Cr.

6. In the process of electrochemically eroding a semiconductor member to a precise dimension, the improvement comprising:

applying light to a wafer made up of gallium arsenide semiconductor layer that is epitaxial with a semi-insulating gallium arsenide layer doped with chromium whereby photogenerated carriers are produced therein, said light being capable of penetration of said gallium arsenide to the vicinity of said precise dimension, and maintaining said wafer in the presence of said light with at least said gallium aresenide layer immersed in an electrolytic erosion solution capable of eroding said GaAs only in the presence of electric current flowing from said GaAs to said solution, said gallium arsenide layer being unbiased with respect to said solution.

7. The process of claim 6 wherein said etching solution is 10% HCl and said light wavelength is 6328 Å.

8. The process of providing self-alignment in a transistor structure of the type wherein a first electrode is positioned adjacent to but insulated from a second electrode on a semiconductor body comprising the steps of:

masking a portion of the surface of said semiconductor body to define said first electrode, electrochemically eroding a region of said semiconductor body adjacent said masked electrode simultaneously thereby providing an undercut region under said first electrode mask by immersing at least the region to be eroded of a semiconductor body in a fluid, said region being unbiased with respect to said fluid and said fluid having the property that erosion of said semiconductor by said fluid occurs only in the presence of electric current flowing from said semiconductor into said fluid, and illuminating said semiconductor with light having a frequency capable of penetrating into said semiconductor in the vicinity of said specific dimension, and positioning said second electrode at a location defined by said first electrode mask and the vertical level of said etched region.

9. The process of providing self-alignment in a MESFET transistor structure of the type wherein at least one of a source and drain first electrode is positioned adjacent to but insulated from a gate second electrode comprising the steps of:

masking the surface of a semiconductor member to define said first electrode, etching the region adjacent said masked electrode simultaneously thereby providing an undercut region under said first electrode mask, and positioning said second electrode at a location defined by said first electrode mask and the vertical level of said etched region.

* * * * *